(12) United States Patent
Dubin et al.

(10) Patent No.: US 6,349,033 B1
(45) Date of Patent: Feb. 19, 2002

(54) METHOD AND APPARATUS FOR HEAT DISPERSION FROM THE BOTTOM SIDE OF INTEGRATED CIRCUIT PACKAGES ON PRINTED CIRCUIT BOARDS

(75) Inventors: Israel Dubin, Sugar Land, TX (US); Charles M. Erwin, Cupertino, CA (US)

(73) Assignee: Radisys Corporation, Hillsboro, OR (US)

(*) Notice: Subject to any disclaimer, the term of this patent is extended or adjusted under 35 U.S.C. 154(b) by 0 days.

(21) Appl. No.: 09/474,721

(22) Filed: Dec. 29, 1999

(51) Int. Cl.[7] .................................................. H05K 7/20
(52) U.S. Cl. ...................... 361/704; 165/80.2; 165/185; 361/708; 361/719; 361/720; 174/252
(58) Field of Search ............................... 165/80.2, 80.3, 165/185; 174/16.3, 252; 257/706–707, 712–713, 720; 361/699, 702, 704–708, 710, 715–721

(56) References Cited

U.S. PATENT DOCUMENTS 4,831,390 A * 5/1989 Deshpande et al. ......... 361/707
5,739,586 A * 4/1998 Cannizzaro et al. ........ 257/712
5,973,923 A * 10/1999 Jitaru ......................... 361/704

OTHER PUBLICATIONS

Murat OkCay, Ph.D., "Thermal interface under a plastic quad flat pack", *Electronics Cooling*, May, 1998.

* cited by examiner

Primary Examiner—Gregory Thompson
(74) Attorney, Agent, or Firm—Vinson & Elkins, LLP

(57) ABSTRACT

The present invention relates to a method and apparatus of heat dispersion from the bottom side of an integrated circuit package mounted on a printed circuit board ("PCB"). In operation, a heat slug is thermally coupled to the underside of an integrated circuit ("IC") package. In one embodiment, the heat slug comprises a disc made of copper or other thermally conductive material in between two layers of elastomeric, conductive material such as silicone imbedded with aluminum particles. The thermal pad extends through each layer of the PCB, including the ground layer. In this way, the ground layer of the PCB is utilized for heat dispersion.

21 Claims, 2 Drawing Sheets

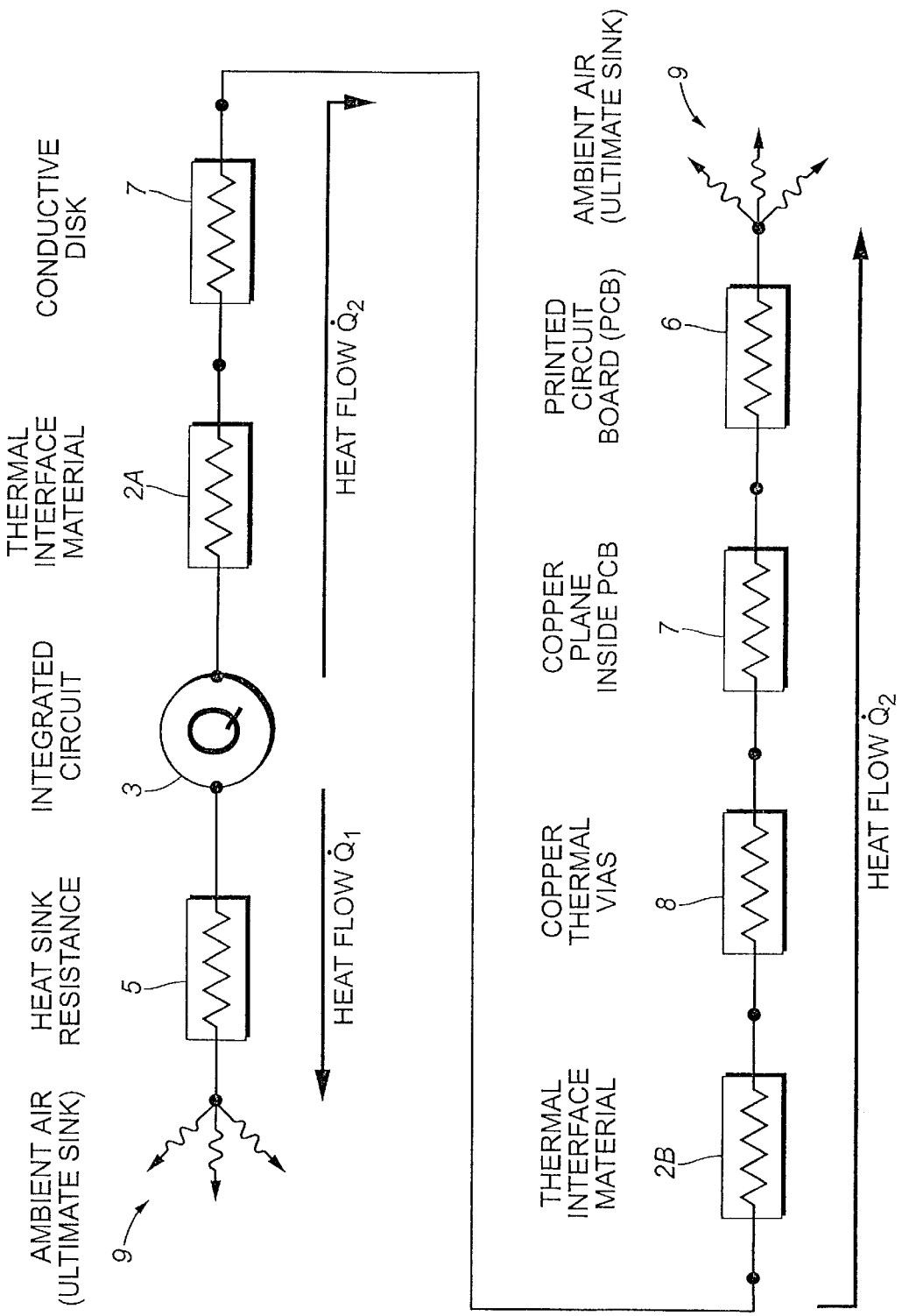

METHOD AND APPARATUS FOR HEAT DISPERSION FROM THE BOTTOM SIDE OF INTEGRATED CIRCUIT PACKAGES ON PRINTED CIRCUIT BOARDS

FIELD OF THE INVENTION

This invention relates generally to the field of integrated circuits mounted on printed circuit boards, and more particularly to methods and apparata for heat dissipation from integrated circuits and printed circuit boards.

RELATED ART

As integrated circuits ("IC's") become increasingly small and carry an increasing number of transistors, heat and heat dispersion become a greater problem. For this reason, computer manufacturers have long used various types of heat distribution systems to attempt to distribute heat and prevent heat buildup on the IC.

One such prior art system is the heat sink. The heat sink is mounted to the top surface of an IC package. The operation of the heat sink is generally as follows: The heat sink is thermally coupled to the top of the integrated circuit package and extends outwardly therefrom. Heat is conducted from the top surface of the IC into the heat sink. The heat sink is configured to provide a relatively great surface area, which in turn facilitates the convective transfer of heat.

The heat sink, while reasonably effective, has several disadvantages. First, heat sinks require a fairly large volume of space, which imposes undesired space limitations on the computer designer. Secondly, the heat sink is thermally coupled only to the top surface of the IC package, providing the underside of the IC package with no heat dispersion other than through convection and the pin-out extending from the IC package.

Another prior art system commonly in use for heat dispersion is the mechanical fan. The fan operates simply by blowing air across the printed circuit board ("PCB"), thereby augmenting the convective heat loss. The fan may or may not be used in connection with a heat sink, as described above. While somewhat effective, mechanical fans suffer from frequent mechanical breakdowns. In addition, mechanical fans become less effective as PCB's and IC packages are more densely configured within the computer system since airflow is diminished.

BRIEF DESCRIPTION OF THE DRAWINGS

The present invention is illustrated by way of example, and not by way of limitation, in the figures of the accompanying drawings and in which like reference numerals refer to like elements and in which:

FIG. 3 is a heat flow diagram for one embodiment of the present invention.

DESCRIPTION OF A PREFERRED EMBODIMENT

The present invention operates as follows. In socketed and surface mounted IC packages, the bottom surface is not normally in contact with the PCB. Consequently, the bottom surface is not an effective dissipative mechanism. The present invention utilizes a thermal disc assembly which is thermally coupled to the underside of the IC package and to a thermal pad which extends through each layer of the PCB.

The thermal disc assembly creates an enhanced secondary and supplementary heat flow path from a socketed IC to the ultimate ambient air sink. Traditional thermal solutions implement a IC case-mounted heat sink as the only means of heat removal. The thermal disc assembly enhances the thermal performance of the overall cooling solution by removing heat from the bottom of the IC substrate. This is in addition to the heat removed by the primary heat sink. The combination of the two heat removal mechanisms provide superior thermal performance to traditional heat sink solutions.

Figure 1:
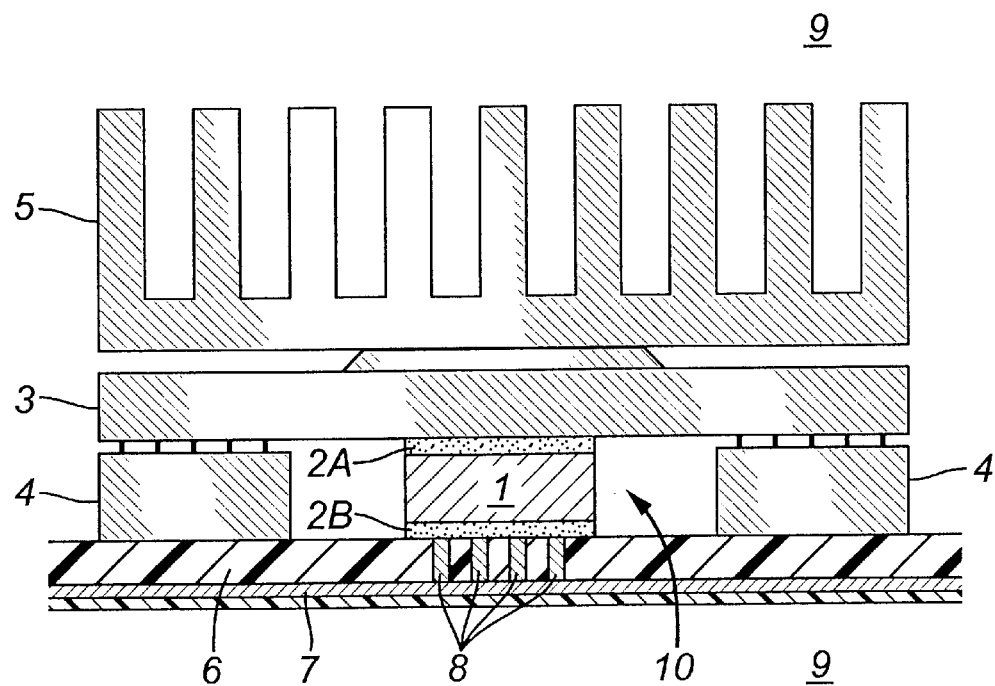
FIG. 1 illustrates an embodiment of the thermal disc assembly of the present invention configured on an IC mounted on a PCB.

Referring now to FIG. 1, in one embodiment the conductive disc 1 is comprised of a highly thermally conductive material, such as copper. The conductive disc 1 may be cylindrical in shape. On either side of the conductive disc are thermal interface layers 2A and 2B, which may be composed of elastomeric, conductive materials, such as silicone embedded with aluminum particles. The two thermal interface layers 2A and 2B and the conductive disc 1 comprise the thermal disc assembly 10, which is placed in thermal contact with the underside of the IC package 3 (upwardly in FIG. 1), and the thermal vias 8. The thermal vias extend through the PCB 6 to a ground layer 7 within the PCB 6. Ground layer 7 is typically a copper plane disposed within PCB 6.

Alternatively, the thermal vias 8 could transfer heat to a point external to the PCB 6. A traditional heat sink 5 may or may not be present, depending on specifications and tolerances of the IC and PCB. The traditional heat sink dissipates heat to the ambient air 9. Thus, the invention operates as follows: heat is dissipated through the thermal disc assembly 10, into the thermal vias and ground layer 7.

In an alternative embodiment, a thermally conductive elastomer may be injected in liquid form to replace the copper thermal vias 8 and the thermal interface layer 2B. The liquid material may be any thermally conductive material, such as silicone embedded with aluminum or other conductive metal. In this embodiment, greater tolerances may be found to exist with respect to the sizing of the thermal disc assembly 10.

Figure 2:
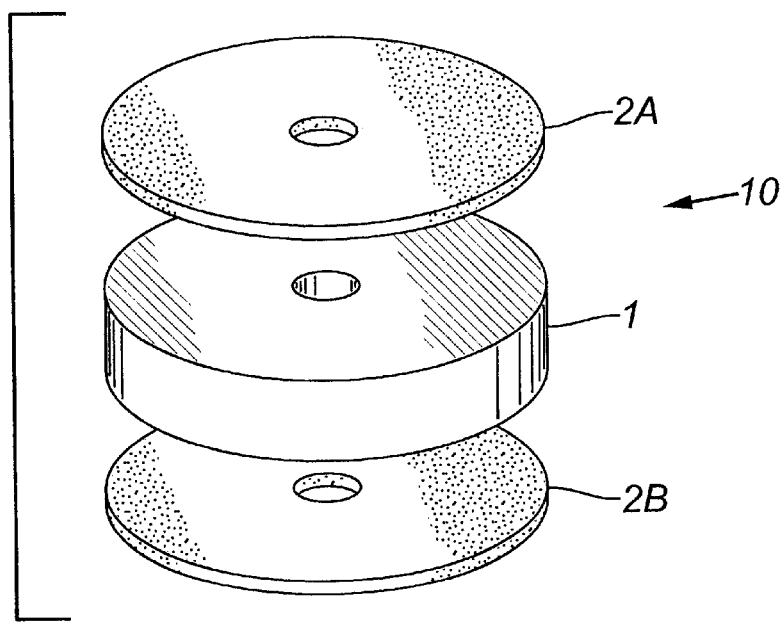
FIG. 2 is an exploded view of the thermal disc assembly of the present invention.

FIG. 2 depicts an exploded view of one embodiment of thermal disc assembly 10. As can be seen, thermal interface layer 2A is formed of roughly the same diameter as conductive disc 1. Thermal interface layer can be any elastomeric, conductive material, such as silicone embedded with aluminum particles. The benefit of using an elastomeric material for thermal interface layer 2A is that it increases tolerances in the assembly, since thermal interface layer 2A must be in contact with IC 3. Conductive disc 1 is disposed beneath thermal interface layer 2A. In the preferred embodiment, the height of conductive disc 1 is maximized since its conductivity would typically be greater than that of an elastomeric material, such as silicone embedded with metal. Thermal disc assembly 10 further includes a second thermal interface layer 2B which is placed in thermal contact with the conductive disc 1 and the thermal vias 8, possibly through a thin layer in the PCB 6.

Alternatively, thermal interface layers 2A or 2B may be of greater or lesser diameter than conductive disc assembly 1, depending on the requirements of the application of the thermal disc assembly 10.

FIG. 3 shows a heat flow diagram which further illustrates the operation of the preferred embodiment of the present invention. The integrated circuit 3 generates heat (Q) while in an operational mode. Most of this heat Q is dissipated through the primary heat sink 5 into the surrounding ambient air 9, following heat flow path $Q_1$.

In traditional "single heat sink" thermal solutions, some percentage of the heat Q remains on the IC 3, causing an undesirable temperature rise on IC 3, which may be a processor die. When the present invention is used in the thermal solution, much of the heat Q remaining on the IC 3 can be carried away through a secondary heat path to the ultimate ambient air 9. This secondary heat flow path is shown as $Q_2$ on the heat flow diagram shown in FIG. 3.

The secondary heat flow path Q2 starts from the bottom side of IC 3. Heat then passes into the thermal disc assembly 10 consisting of conductive disc 1 and thermal interface layers 2A and 2B. Heat Q then passes through the top surface of the fiberglass PCB 6 through several copper thermal vias 8 drilled into or otherwise formed in the PCB. These vias 8 carry the heat Q into a highly conductive copper plane 7 sandwiched into the PCB 6 near the rear surface of the PCB 6. Heat Q spreads across this copper plane 7 and passes through a thin final fiberglass layer (or no layer) on the PCB 6 and is dissipated from the back side of the PCB 6 via natural convection.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true scope of the invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A thermal disc assembly for providing heat dissipation from an integrated circuit having an underside, comprising:
    a first elastomeric, conductive layer having a top and bottom surface, wherein the top surface of said first elastomeric, conductive layer is adapted to be thermally coupled to the underside of the integrated circuit;
    a conductive disc having a top and bottom surface, wherein said top surface of said conductive disc is thermally coupled to said bottom surface of said first elastomeric, conductive layer;
    a second elastomeric, conductive layer having a top and bottom surface, wherein the top surface of said second elastomeric, conductive layer is thermally coupled to said bottom surface of said conductive disc, and wherein said bottom surface of said second elastomeric, conductive layer is in thermal contact with a printed circuit board.

2. The thermal disc assembly of claim 1, wherein said first and second elastomeric, conductive layers comprise a metal dispersed within an elastomeric medium.

3. The thermal disc assembly of claim 2, wherein said elastomeric medium comprises silicone.

4. The thermal disc assembly of claim 1, wherein said conductive disc is formed in the shape of a cylinder having a diameter.

5. The thermal disc assembly of claim 4, wherein said first and second elastomeric, conductive layers are formed in the shape of cylinders having diameters.

6. The thermal disc assembly of claim 5, wherein said diameters of said conductive disc, said first conductive layer, and said second conductive layers are approximately equal.

7. The thermal disc assembly of claim 1, wherein said conductive disc comprises copper.

8. A printed circuit board having a top surface and bottom surface, said printed circuit board designed for providing heat dissipation from an integrated circuit mounted on said printed circuit board, said integrated circuit having an underside, comprising:
    a first elastomeric, conductive layer having a top and bottom surface, wherein the top surface of said first elastomeric, conductive layer is adapted to be thermally coupled to the underside of the integrated circuit;
    a conductive disc having a top and bottom surface, wherein said top surface of said conductive disc is thermally coupled to said bottom surface of said first elastomeric, conductive layer;
    a second elastomeric, conductive layer having a top and bottom surface, wherein the top surface of said second elastomeric, conductive layer is thermally coupled to said bottom surface of said conductive disc, and wherein said bottom surface of said second elastomeric, conductive layer is in thermal contact with a printed circuit board;
    thermal vias extending vertically within said printed circuit board and in thermal contact with said second bottom side of said second elastomeric, conductive layer; and
    a ground plane extending horizontally through said printed circuit board and thermally coupled to said thermal vias.

9. The printed circuit board of claim 8, wherein said first and second elastomeric, conductive layers comprise a metal dispersed within an elastomeric medium.

10. The printed circuit board of claim 9, wherein said elastomeric medium comprises silicone.

11. The printed circuit board of claim 8, wherein said conductive disc is formed in the shape of a cylinder having a diameter.

12. The printed circuit board of claim 11, wherein said first and second elastomeric, conductive layers are formed in the shape of cylinders having diameters.

13. The printed circuit board of claim 12, wherein said diameters of said conductive disc, said first conductive layer, and said second conductive layers are approximately equal.

14. The printed circuit board of claim 8, wherein said conductive disc comprises copper.

15. The printed circuit board of claim 8, wherein said thermal vias comprise copper.

16. The printed circuit board of claim 8, wherein said thermal vias comprise thermally conductive elastomers having a liquid form, said thermally conductive elastomer being injected into said printed circuit board while said thermally conductive elastomer is in said liquid form.

17. A method of dissipating heat from an integrated circuit having a bottom surface, said integrated circuit being mounted on a printed circuit board having a top surface, comprising:

positioning a conductive disc in thermal contact with said bottom surface of said integrated circuit and said top surface of said printed circuit board, said conductive disc having a top side and a bottom side; and disposing thermal vias within said printed circuit board for channeling heat away from said integrated circuit into said printed circuit board, wherein said thermal vias are in thermal contact with said top surface of said printed circuit board; and placing said top side of said conductive disc in thermal contact with a first layer of thermally elastomeric, conductive material.

18. The method of claim 17, wherein said bottom side of said conductive disc is placed in thermal contact with a second layer of elastomeric, thermally conductive material.

19. The method of claim 18, wherein said first layer of elastomeric, thermally conductive material has a top side and a bottom side, and wherein said top side of said first layer of elastomeric, thermally conductive material is placed in thermal contact with said bottom side of said integrated circuit.

20. The method of claim 19, wherein said second layer of elastomeric, thermally conductive material has a top side and a bottom side, and wherein said bottom side of said second elastomeric, thermally conductive material is placed in thermal contact with said top side of said printed circuit board.

21. The method of claim 17, wherein said thermal vias are created by drilling cavities in said printed circuit board and injecting a liquid, thermally conductive elastomer into said cavities in said printed circuit board.

* * * * *